United States Patent [19]

Paschke et al.

[11] Patent Number: 5,102,818
[45] Date of Patent: Apr. 7, 1992

[54] METHOD FOR THE SMOOTH FINE CLASSIFICATION OF VARACTOR DIODES

[75] Inventors: Klaus Paschke, Kenzingen; Roland Zipfel, Freiburg-Tiengen, both of Fed. Rep. of Germany

[73] Assignee: Deutsche ITT Industries GmbH, Freiburg, Fed. Rep. of Germany

[21] Appl. No.: 582,442

[22] Filed: Sep. 13, 1990

[30] Foreign Application Priority Data

Sep. 21, 1989 [DE] Fed. Rep. of Germany ....... 3931495
Jun. 13, 1990 [EP] European Pat. Off. ........ 90111156.7

[51] Int. Cl.$^5$ ...................... H01L 21/70; H01L 27/00
[52] U.S. Cl. ......................................... 437/51; 437/6; 437/8; 437/904; 437/207; 148/DIG. 162; 148/DIG. 28; 324/158 D
[58] Field of Search .................... 437/51, 6, 7, 8, 904, 437/906, 207, 211; 148/DIG. 162, DIG. 28; 324/158 D, 158 T; 29/593

[56] References Cited

U.S. PATENT DOCUMENTS

| | | | |
|---|---|---|---|
| 3,587,852 | 6/1971 | Kamm et al. | 209/748 |
| 4,151,638 | 5/1979 | Welling | 437/207 |
| 4,488,354 | 12/1984 | Chan et al. | 29/593 |
| 4,607,219 | 8/1986 | Isosaka | 324/158 T |
| 4,696,712 | 9/1987 | Nonaka | 437/8 |
| 4,778,771 | 10/1988 | Hiki | 325/158 T |
| 4,813,573 | 3/1989 | Anderson | 221/233 |
| 4,816,422 | 3/1989 | Yerman et al. | 437/51 |
| 4,859,614 | 8/1989 | Sugahara et al. | 437/8 |
| 4,990,462 | 2/1991 | Sliwa, Jr. | 148/DIG. 28 |
| 5,039,602 | 8/1991 | Merrill et al. | 437/51 |

FOREIGN PATENT DOCUMENTS

| | | | |
|---|---|---|---|
| 63-221684 | 9/1988 | Japan | 437/51 |
| 2-125635 | 5/1990 | Japan | 437/51 |
| 2-226752 | 9/1990 | Japan | 437/51 |

OTHER PUBLICATIONS

Western Electric, Technical Digest No. 35, Jul. 1974, "Testing and Sorting Apparatus"; R. M. Filek, P. L. Herr, D. M. Large; pp. 19-20.

IEEE Transactions on Instrumentation and Measurement; vol. IM-17, No. 1; 3/68; "An Automatic Data Acquisition System for Semiconductor Device Testing", D. L. Bartling, C. R. Jenkins, C. A. Goben; pp. 19-28.

IBM Technical Disclosure Bulletin; vol. 31, No. 5; Oct. 1988; "Chip Sorting Buffer Mechanism for Chip Mounting Machine"; pp. 191-192.

Primary Examiner—Brian E. Hearn
Assistant Examiner—Kevin Picardat
Attorney, Agent, or Firm—Thomas L. Peterson

[57] ABSTRACT

A "smooth" fine classification of varactor diodes according to their electrical parameters is achieved in the manufacturing process to provide groups of matched varactor diodes. The diodes are matched within a predetermined tolerance limit. The dice are picked up from the silicon wafer along a meander path generally perpendicular to the temperature gradient of the diffusion process steps applied to the wafer when the diodes were formed, mounted on a lead frame, bonded, encapsulated, removed from the lead frame, and measured.

9 Claims, 1 Drawing Sheet

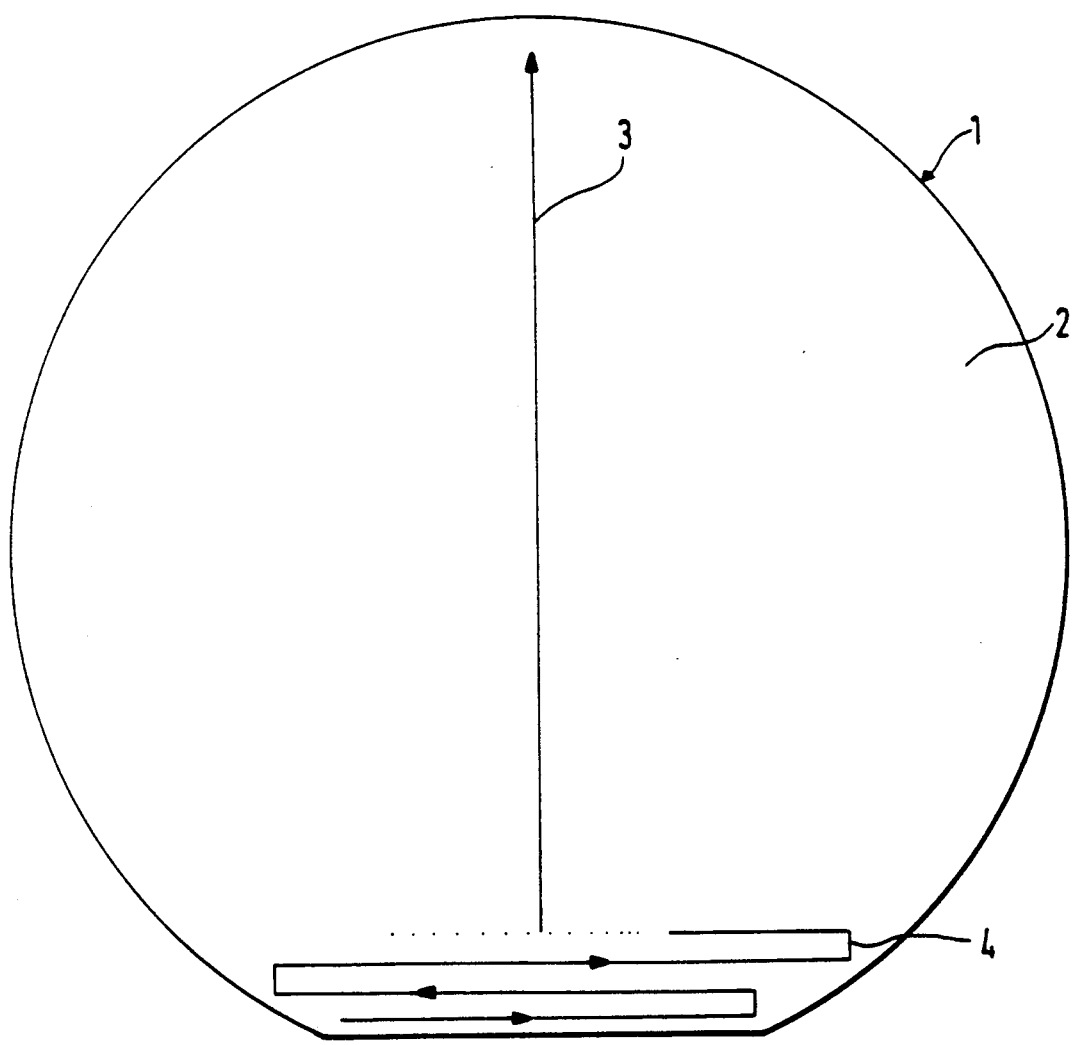

5,102,818

METHOD FOR THE SMOOTH FINE CLASSIFICATION OF VARACTOR DIODES

BACKGROUND OF THE INVENTION

1. Field of the Invention

The present invention relates to a method which makes it possible to finely classify varactor diodes, i.e., to group varactor diodes of like parameters within close tolerance units in a simple manner.

2. The Prior Art

Due to spreads in the fabrication of both the silicon wafers and the varactor diodes on the silicon wafers, the individual varactor diodes, hereinafter referred to as "diodes", unavoidably have process-induced variations in their electrical parameters and, thus, different capacitance-voltage characteristics.

The silicon wafer with the diodes formed thereon is commonly covered with a sheet on one side and then separated into dice. After the sheet has been detached, the dice are obtained as bulk goods. After suitable classifying and mounting processes, the dice are encapsulated.

Costly and complicated measuring and sorting operations are necessary to find diodes with matching capacitance-voltage characteristics among the large number of diodes with different parameters. See for example, IBM Technical Disclosure Bulletin, Vol. 31, No. 5, pages 191-2, Oct. 1988. It is indispensable, for example, to find matching diodes for the manufacture of television tuners, where between four and eight such matching diodes are commonly needed.

Since it is impossible to create a suitable measurement program for thousands of fine groups, there is no alternative but to confine oneself to, e.g., statistically about 80 of the most pronounced groups as determined in preliminary tests. This, too, requires a considerable amount of apparatus and time. The spread of the component values of a group is typically 2.5%. The quantitative distribution to individual groups varies widely, so that a considerable volume of bulk goods is required to accumulate a meaningful number of pieces per fine group, and the number of like diodes of a group may grow only slowly. In addition, there is always a considerable residue which does not fit into any group, and which is added to a new batch of diodes to be classified. Thus, the percentage of unsuitable diodes, i.e., diodes which do not "match" and have to be discarded, inevitably increases from batch to batch.

It is, therefore, the object of the invention to provide a method which permits a simpler and more economical fine classification of diodes with like electrical parameters.

BRIEF SUMMARY OF THE INVENTION

The invention is a method for a smooth, fine classification of varactor diodes of like electrical parameters which comprises the steps of forming the diodes on a silicon wafer and dicing the silicon wafer bearing the diodes to isolate each diode on a die. The dice is held by a sheet. Each die containing a diode is serially picked up along a meander path. Each the die is mounted on a lead frame. Selected points on the diode are bonded to correspondingly selected points on the lead frame with lead wires. The bonded, mounted die is encapsulated in plastic. The lead frame is tin plated. Cross-links are removed from the lead frame to leave longitudinal links of the lead frame. The remaining lead frame is cropped to leave longitudinal links with the diodes and lead wires disposed therebetween. Each lead frame with its corresponding die is grasped by a clamping device of a clocked measuring wheel which introduces them into the individual measuring stations for determining the electrical parameters of the diode. The diode, lead frame, wire leads and encapsulization comprise the varactor diode. Varactor diodes lying outside a predetermined tolerance limit are eliminated. Those remaining varactor diodes meeting the predetermined tolerance limit are picked up and placed via a buffer wheel on the conveyor belt.

In the preferred embodiment the dice are picked up along a meander path generally perpendicular to the temperature gradient across the silicon wafer. The dice are mounted on a lead frame by alloying.

The invention can also be characterized as a method for a smooth, fine classification of varactor diodes of like electrical parameters comprising the steps of forming the diodes on a silicon wafer in a two dimensional array. The silicon wafer bearing the diodes are diced to isolate each diode on a die. The dice are retained in the two dimensional array as formed. Each die containing a diode is serially selected along a meander path across the array to form an ordered series of dies. A corresponding ordered series of completed varactor diodes are formed from the ordered series of dies. The electrical parameters of each varactor diode in the ordered series are determined while the order of the series is retained. Varactor diodes lying outside a predetermined tolerance limit are eliminated. Those remaining varactor diodes meeting the predetermined tolerance limit are segregated into sets selected from the ordered series of varactor diodes. Each set has selected electrical parameters which are matched within the predetermined tolerance limit.

The dice are selected along a meander path generally perpendicular to the temperature gradient of diffusion processes applied to the silicon wafer to form the diodes.

The invention is based on recognition that adjacent diode dice on a silicon wafer have approximately identical capacitance-voltage characteristics even though, due to manufacturing variations in the diffusion processes, particularly in the vertical direction, a considerable temperature gradient in the capacitance-voltage characteristic occurs across the wafer. In the methods hitherto used to classify finished diodes, the above-mentioned similarity could not be utilized for systematic reasons.

BRIEF DESCRIPTION OF THE DRAWINGS

FIG. 1 is a top plan view of a silicon wafer in which the method of classification of diode dice is practiced.

DETAILED DESCRIPTION OF THE PREFERRED EMBODIMENT

A "smooth" fine classification of varactor diodes according to their electrical parameters is achieved in the manufacturing process to provide groups of matched varactor diodes. The diodes are matched within a predetermined tolerance limit. The dice are picked up from the silicon wafer along a meander path generally perpendicular to the temperature gradient of the diffusion process steps applied to the wafer when the diodes were formed, mounted on a lead frame, bonded, encapsulated, removed from the lead frame, and measured.

The invention will now be explained with reference to the accompanying drawing, which shows schematically a silicon wafer 1 with a plurality of diode dice 2 fabricated thereon in a conventional manner. The vertical arrow 3 shows the direction of the temperature gradient of the capacitance-voltage characteristic of the individual diode devices. In the method according to the invention, the dice obtained by separating the silicon wafer 1 no longer become disordered bulk goods but are picked up by a gripper arm following a meander or generally serpentine path 4 perpendicular to the temperature gradient across the wafer 1. The starting point is arbitrary, i.e., in the Figure the gripper may begin with the first pickup step at the edge of the wafer either at the bottom or at the top.

The meandering pickup follows a path 4 of the least difference in temperature gradient. In this manner, after the subsequent treatment according to the invention, the diode devices whose capacitance-voltage characteristics match best are serially provided on a conventional conveyor belt. Moreover, in the event of a failure, a diode die will find a corresponding neighbor after a given sequence of steps. The picked-up diode dice 2 are placed on a suitable lead frame and mounted there by, e.g., alloying.

In the next step, the second contact is made via a bond wire, and after being sealed with synthetic-resin powder, the lead frame with the diode dice mounted thereon is encapsulated, e.g., coated in a synthetic-resin compound.

The lead frame with the encapsulated diodes is then tin-plated, and in the last station, the diodes are cropped from the lead frame and classified.

There, in a first step, the cross-links of the lead frame are removed in a stamping operation, so that the diodes are held only at their two lead wires by the remaining side links of the lead frame.

In the next step, these holding links are removed, and the individual diodes are grasped by corresponding clamping devices of a clocked measuring wheel. They are then moved step by step by the measuring wheel past a number of measuring points equal to the number of parameters to be measured. The measured values are collected and analyzed by a computer, and the diodes lying outside the predetermined tolerance limit are discarded. The "usable" diodes are transferred from the measuring wheel to a buffer wheel. There they are stored until a number of, e.g. ten, matching diodes is reached, which are then removed from the wheel and put in the pockets of one of the conventional conveyer belts (blister belts). If any one of the ten diodes differs too much from the average value, it will be discarded so as to increase the fine-classification yield. The diodes on the blister belt are then fine-classified "smoothly", i.e., at any point of the belt, that ten adjacent diodes are within the predetermined spread.

The method according to the invention makes it possible to include about 90% of the diodes on a silicon wafer in a "smooth" fine classification. A so-called diode quartet then has a typical spread of only 0.4%. This reduces the amount of alignment work to be performed by the user, which results in considerable cost savings.

We claim:

1. A method for a smooth fine classification of varactor diodes of like electrical parameters comprising the steps of:
   forming said diodes on a silicon wafer;
   dicing said silicon wafer bearing said diodes to isolate each diode on a die;
   holding said dice by a sheet;
   serially picking up each die containing a diode along a meander path;
   mounting each said die on a lead frame;
   bonding selected points on said diode to correspondingly selected points on said lead frame with lead wires;
   encapsulating said bonded, mounted die;
   tin-plating said lead frame;
   removing cross-links from said lead frame to leave longitudinal links of said lead frame;
   cropping the remaining lead frame comprising longitudinal links with the diodes and lead wires disposed therebetween;
   grasping each lead frame with its corresponding die by a clamping device of a clocked measuring wheel which introduces them into the individual measuring stations for determining the electrical parameters of said diode, said diode, lead frame, wire leads and encapsulization comprising said varactor diode;
   eliminating varactor diodes lying outside a predetermined tolerance limit;
   picking up those remaining varactor diodes meeting said predetermined tolerance limit; and
   placing said remaining varactor diodes via a buffer wheel on the conveyor belt.

2. The method of claim 1 where in the step of serially picking up said dice, said dice are picked up along a meander path generally perpendicular to the temperature gradient across the silicon wafer.

3. The method of claim 1 where in the step of mounting said dice, said dice are mounted on a lead frame by alloying.

4. A method for a smooth fine classification of varactor diodes of like electrical parameters comprising the steps of:
   forming said diodes on a silicon wafer in a two dimensional array;
   dicing said silicon wafer bearing said diodes to isolate each diode on a die;
   retaining said dice in said two dimensional array as formed;
   serially selecting each die containing a diode along a meander path across said array to form an ordered series of dies;
   forming a corresponding ordered series of completed varactor diodes from said ordered series of dies;
   determining the electrical parameters of each varactor diode in said ordered series in the order of said series;
   eliminating varactor diodes lying outside a predetermined tolerance limit; and
   segregating those remaining varactor diodes meeting said predetermined tolerance limit into sets selected from said ordered series of varactor diodes, each set having selected electrical parameters which are matched within said predetermined tolerance limit.

5. The method of claim 4 where in said step of serially selecting said dice, said dice are selected along a meander path generally perpendicular to the temperature gradient of diffusion processes applied across the silicon wafer.

6. An improvement in a method for a smooth fine classification of varactor diodes of like electrical parameters wherein said diodes are formed on a silicon wafer in a two dimensional array, and wherein said silicon wafer is diced to isolate each diode on a die, said improvement comprising the steps of:

retaining said dice in said two dimensional array as formed;

serially selecting each die containing a diode along a meander path across said array to form an ordered series of dies;

forming a corresponding ordered series of completed varactor diodes from said ordered series of dies;

determining the electrical parameters of each varactor diode in said ordered series while retaining the order of said varactor diodes as selected from said array; and selectively eliminating varactor diodes lying outside a predetermined tolerance limit from said ordered series of varactor diodes, whereby those remaining varactor diodes meeting said predetermined tolerance limit are grouped into sets selected from said ordered series of varactor diodes, each set having selected electrical parameters which are matched within said predetermined tolerance limit.

7. The method of claim 6 where in said step of serially selecting said dice, said dice are selected along a meander path generally perpendicular to the temperature gradient of diffusion processes applied to said silicon wafer to form said diodes.

8. An improvement in a method for a smooth, fine classification of varactor diodes of like electrical parameters wherein said diodes are formed on a silicon wafer in a two dimensional array with a fixed direction of temperature gradient in any diffusion processes applied to said wafer during formation of said diodes, and wherein said silicon wafer is diced to isolate each diode on a die, said improvement comprising the steps of:

selecting adjacent diode dice on a silicon wafer to form an ordered series of diode dice; and fabricating varactor diodes from said ordered series of diode dice to form a corresponding ordered series of varactor diodes.

9. The improvement of claim 8 further comprising the step of forming groups of varactor diodes have approximately identical capacitance-voltage characteristics from sets of consecutive varactor diodes selected from said ordered series of varactor diodes even though, due to manufacturing variations in said step of fabrication, a considerable variation in the capacitance-voltage characteristic occurs across said wafer in a predetermined direction, said step of selecting being performed in a direction generally perpendicular to said predetermined direction.

* * * * *